(12) United States Patent
Lee et al.

(10) Patent No.: US 8,638,030 B2
(45) Date of Patent: Jan. 28, 2014

(54) ORGANIC LIGHT EMITTING DISPLAY DEVICE INCLUDING PIXEL ELECTRODE NOT FORMED IN LIGHT TRANSMISSIVE REGION

(75) Inventors: Moon-Jae Lee, Yongin (KR); Won-Jun Song, Yongin (KR); Sun-Hee Lee, Yongin (KR); Young-Hee Lee, Yongin (KR); Hee-Chang Park, Yongin (KR); Mu-Hyun Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 30 days.

(21) Appl. No.: 12/876,981

(22) Filed: Sep. 7, 2010

(65) Prior Publication Data

US 2011/0163661 A1    Jul. 7, 2011

(30) Foreign Application Priority Data

Jan. 5, 2010    (KR) .................. 10-2010-0000569

(51) Int. Cl.
*H01L 51/50* (2006.01)
*H01L 31/042* (2006.01)

(52) U.S. Cl.
USPC .......................................... 313/504; 313/506

(58) Field of Classification Search
USPC ...................................... 313/504, 506; 257/40
See application file for complete search history.

(56) References Cited

U.S. PATENT DOCUMENTS

| | | | |
|---|---|---|---|
| 6,356,031 B1 | 3/2002 | Thagard et al. | |
| 6,765,641 B1 | 7/2004 | Kubo et al. | |
| 7,645,478 B2 * | 1/2010 | Thelss et al. | 427/66 |
| 2002/0142188 A1 * | 10/2002 | Andriash | 428/690 |
| 2003/0197179 A1 | 10/2003 | Yamazaki et al. | |
| 2005/0236979 A1 * | 10/2005 | Kwak et al. | 313/504 |
| 2009/0195148 A1 * | 8/2009 | Lee et al. | 313/504 |

(Continued)

FOREIGN PATENT DOCUMENTS

| | | |
|---|---|---|
| JP | 11-004003 A | 1/1999 |
| JP | 2000-277786 A | 10/2000 |

(Continued)

OTHER PUBLICATIONS

Korean Office Action dated Mar. 16, 2011 for Korean Patent Application No. KR 10-2010-0000569.

(Continued)

*Primary Examiner* — Anh Mai
(74) *Attorney, Agent, or Firm* — Knobbe Martens Olson & Bear LLP

(57) ABSTRACT

An organic light emitting display device is disclosed. In one embodiment, the organic light emitting display device includes: i) a substrate having a transmitting region and a plurality of pixel regions separated from each other by the transmitting region, wherein the substrate has first and second surfaces opposing each other; ii) at least one thin film transistor formed in each of the pixel regions over the first surface of the substrate and iii) a passivation film covering the thin film transistors. The device may further include a plurality of pixel electrodes formed on the passivation film, wherein each of the pixel electrodes is electrically connected to and formed substantially directly above the corresponding thin film transistor, wherein each of the pixel electrodes is formed only in the corresponding pixel region, and wherein the pixel electrodes are separated from each other. The device may further include a solar cell active layer formed below the second surface.

18 Claims, 9 Drawing Sheets

(56) References Cited

U.S. PATENT DOCUMENTS

| | | | |
|---|---|---|---|
| 2009/0243472 A1* | 10/2009 | Jeong et al. | 313/504 |
| 2010/0026170 A1* | 2/2010 | Kim et al. | 313/504 |
| 2010/0033087 A1* | 2/2010 | Kim et al. | 313/504 |
| 2010/0052518 A1* | 3/2010 | Jeon et al. | 313/504 |
| 2010/0052520 A1* | 3/2010 | Jeon et al. | 313/504 |
| 2010/0231124 A1* | 9/2010 | Song | 313/504 |

FOREIGN PATENT DOCUMENTS

| | | |
|---|---|---|
| JP | 2002-006769 A | 1/2002 |
| JP | 2002-008851 A | 1/2002 |
| JP | 2003-142168 A | 5/2003 |
| JP | 2004-010403 A | 1/2004 |
| JP | 2005-331665 A | 12/2005 |
| JP | 2006-128241 A | 5/2006 |
| JP | 2007-242985 A | 9/2007 |
| JP | 2007242985 A * | 9/2007 |
| JP | 2008-112112 A | 5/2008 |
| JP | 2009-237573 A | 10/2009 |
| JP | 2009-266503 A | 11/2009 |
| KR | 20-0320880 | 7/2003 |
| KR | 10-2005-0035595 | 4/2005 |
| KR | 10-2005-0083243 | 8/2005 |
| KR | 10-0787464 B1 | 12/2007 |
| KR | 10-2008-0065120 | 7/2008 |
| KR | 10-2009-0100920 A | 9/2009 |

OTHER PUBLICATIONS

Japanese Official Action dated Mar. 31, 2012 for Japanese Patent Application No. JP 2010-152930 which shares priority of Korean Patent Application No. KR 10-2010-0000569.

Korean Office Action dated Nov. 11, 2011 for Korean Patent Application No. KR 10-2010-0000569.

Japanese Office Action dated Nov. 6, 2012 for Japanese Patent Application No. JP 2010-152930 which shares priority of Korean Patent Application No. KR 10-2010-0000569.

* cited by examiner

ORGANIC LIGHT EMITTING DISPLAY DEVICE INCLUDING PIXEL ELECTRODE NOT FORMED IN LIGHT TRANSMISSIVE REGION

CROSS-REFERENCE TO RELATED PATENT APPLICATION

This application claims the benefit of Korean Patent Application No. 10-2010-0000569, filed on Jan. 5, 2010, in the Korean Intellectual Property Office, the disclosure of which is incorporated herein in its entirety by reference.

BACKGROUND OF THE INVENTION

1. Field of the Invention

The described technology generally relates to an organic light emitting display device, and more particularly, to a transparent organic light emitting display device.

2. Description of the Related Technology

Organic light emitting displays generally have wide viewing angles, high contrast ratios, short response times, and reduced power consumption. The displays may be used across a variety of applications such as personal portable devices (e.g., MP3 players and mobile phones) or a large screen display (e.g., television sets).

SUMMARY OF CERTAIN INVENTIVE ASPECTS

One aspect of the invention is a transparent organic light emitting display device that can prevent distortion of an image transmitted therethrough by preventing light scattering during image display.

Another aspect is an organic light emitting display device that has reduced power consumption by using power obtained from a solar cell as an auxiliary power source for driving the organic light emitting display device.

Another aspect is an organic light emitting display device including: a substrate having a transmitting region and a plurality of pixel regions separated from each other by the transmitting region interposed between the pixel regions; a thin film transistor that is positioned on a first surface of the substrate and disposed in the pixel regions of the substrate; a passivation film covering the thin film transistor; a pixel electrode that is formed on the passivation film to be electrically connected to the thin film transistor, is located in the pixel regions, and is disposed to overlap and cover the thin film transistor; a facing electrode that faces the pixel electrode and is formed to be able to transmit light; an organic light emitting layer that is interposed between the pixel electrode and the facing electrode to emit light; a first electrode formed on a second surface of the substrate; a second electrode facing the first electrode; and a solar cell active layer interposed between the first electrode and the second electrode.

Another aspect is an organic light emitting display device including: a substrate having a transmitting region and a plurality of pixel regions separated from each other by the transmitting region interposed between the pixel regions; a pixel circuit unit that is formed on a first surface of the substrate, includes a thin film transistor, and is positioned in the pixel regions; a first insulating film covering the pixel circuit unit; a pixel electrode that is formed on the first insulating film to be electrically connected to the pixel circuit unit, and is disposed to overlap and cover the pixel circuit unit; a facing electrode facing the pixel electrode; an organic light emitting layer that is interposed between the pixel electrode and the facing electrode to emit light; a first electrode formed on a second surface of the substrate; a second electrode facing the first electrode; and a solar cell active layer interposed between the first electrode and the second electrode.

Another aspect is an organic light emitting display device comprising: a substrate having a transmitting region and a plurality of pixel regions separated from each other by the transmitting region, wherein the transmitting region is configured to transmit light therethrough, wherein the pixel regions are configured to display an image, and wherein the substrate has first and second surfaces opposing each other; at least one thin film transistor formed in each of the pixel regions over the first surface of the substrate; a passivation film covering the thin film transistors; a plurality of pixel electrodes formed on the passivation film, wherein each of the pixel electrodes is electrically connected to and formed substantially directly above the corresponding thin film transistor, wherein each of the pixel electrodes is formed only in the corresponding pixel region, and wherein the pixel electrodes are separated from each other; an organic light emitting layer formed on each of the pixel electrodes and configured to emit light; a facing electrode formed on the organic light emitting layer and configured to transmit light; a first electrode formed on the second surface of the substrate; a solar cell active layer formed on the first electrode; and a second electrode formed on the solar cell active layer, wherein the first electrode is closer to the substrate than the second electrode.

In the above device, each of the pixel electrodes has an area substantially identical to that of one of the pixel regions. The above device further comprises a plurality of conductive lines formed in each of the pixel regions and electrically connected to the corresponding thin film transistor, wherein all of the conductive lines are formed substantially directly below the corresponding pixel electrode. In the above device, a ratio of 1) a total area of the transmitting region with respect to 2) a total area of the pixel regions and the transmitting region is between about 20% and about 90%. In the above device, the passivation film is formed on both the transmitting region and the pixel regions and wherein the passivation film is formed of a transparent material. In the above device, the substrate has a transmittance greater than or equal to that of the passivation film.

In the above device, the passivation film is formed on both the transmitting region and the pixel regions, wherein the passivation film has a recess in the transmitting region and wherein the recess is covered by the facing electrode. In the above device, a plurality of insulating films are formed in the transmitting region, wherein the insulating films have a recess covered by the facing electrode.

In the above device, at least one of the first electrode and the second electrode is formed of a transparent material. In the above device, each of the pixel electrodes has a surface which faces the corresponding thin film transistor, and wherein the surface of the pixel electrode is configured to reflect light. In the above device, each of the pixel electrodes has a first length, wherein each of the thin film transistors has a second length, wherein the first and second lengths are defined in a direction substantially parallel with the first surface of the substrate, and wherein the first length is greater than or equal to the second length.

Another aspect is an organic light emitting display device comprising: a substrate having a transmitting region and pixel regions separated from each other by the transmitting region, wherein the transmitting region is configured to transmit light therethrough, wherein the pixel regions are configured to display an image, and wherein the substrate has first and second surfaces opposing each other; a plurality of pixel circuit units formed in the pixel regions over the first surface of the substrate respectively, wherein each of the pixel circuit units comprises at least one thin film transistor; a first insulating film covering the pixel circuit units; a plurality of pixel electrodes formed on the first insulating film, wherein each of the pixel electrodes is electrically connected to and formed substantially directly above the corresponding pixel circuit unit, and wherein the pixel electrodes are separated from each other and formed only in the pixel regions; an organic light emitting layer formed on each of the pixel electrodes and configured to emit light; a facing electrode formed on the organic light emitting layer and configured to transmit light; a first electrode formed on the second surface of the substrate; a solar cell active layer formed on the first electrode; and a second electrode formed on the solar cell active layer, wherein the first electrode is closer to the substrate than the second electrode.

In the above device, each of the pixel electrodes has an area substantially identical to that of one of the pixel regions. The above device further comprises a plurality of conductive lines formed in each of the pixel regions and electrically connected to the corresponding pixel circuit unit, wherein the conductive lines are formed substantially directly below the corresponding pixel electrode. In the above device, a ratio of 1) a total area of the transmitting region with respect to 2) a total area of the pixel regions and the transmitting region is between about 20% and about 90%. In the above device, the transmitting region and the pixel regions each comprise the first insulating film and a plurality of second insulating films, and wherein the first insulating film and the second insulating films are formed of a transparent material.

In the above device, the substrate has a transmittance greater than or equal to the total transmittance of the first insulating film and the second insulating films. In the above device, the transmitting region and the pixel regions each comprise the first insulating film and a plurality of second insulating films, wherein at least one of the first insulating film and the second insulating films has a recess in the transmitting region, and wherein the recess is covered by the facing electrode.

Another aspect is an organic light emitting display device comprising: a substrate in which a light transmissive region and a plurality of pixel regions are formed, wherein the pixel regions are separated from each other by the light transmissive region, wherein the pixel regions are configured to display an image, and wherein the substrate has first and second surfaces opposing each other; at least one pixel circuit formed in each of the pixel regions over the first surface of the substrate; a pixel electrode formed in each of the pixel regions, wherein each of the pixel electrodes is electrically connected to and formed substantially directly above the corresponding pixel circuit, wherein the pixel electrodes are not formed in the light transmissive region; an organic light emitting element formed on the pixel electrode; a first electrode formed on the second surface of the substrate; a solar cell active layer formed on the first electrode; and a second electrode formed on the solar cell active layer, wherein the first electrode is closer to the substrate than the second electrode.

In the above device, each of the pixel electrodes has a first length, wherein each of the pixel circuits has a second length, wherein the first and second lengths are defined in a direction substantially parallel with the first surface of the substrate, and wherein the first length is greater than or equal to the second length.

DETAILED DESCRIPTION OF CERTAIN INVENTIVE EMBODIMENTS

An organic light emitting display is self-emissive. Also, the weight and thickness of the organic light emitting display can be reduced since it does not require an additional light source unlike a liquid crystal display device. Further, the device can be made transparent by using transparent thin film transistors and other transparent elements (e.g., transparent organic light emitting elements).

When a transparent display device is in an off-state, an object or an image, positioned on an opposite side of a user with respect to the transparent device, may be transmitted to the user. This undesirable transmission occurs not only through organic light emitting diodes but also through spaces between patterns of thin film transistors and various wires. Therefore, a distorted image may be transmitted to the user due to the patterns. This is because gaps between the patterns are only a few nanometers, which are close to the wavelengths of visible light, and thus, light scatters while passing through the gaps.

Embodiments of the present invention will now be described more fully with reference to the accompanying drawings in which exemplary embodiments of the invention are shown.

Figure 1:
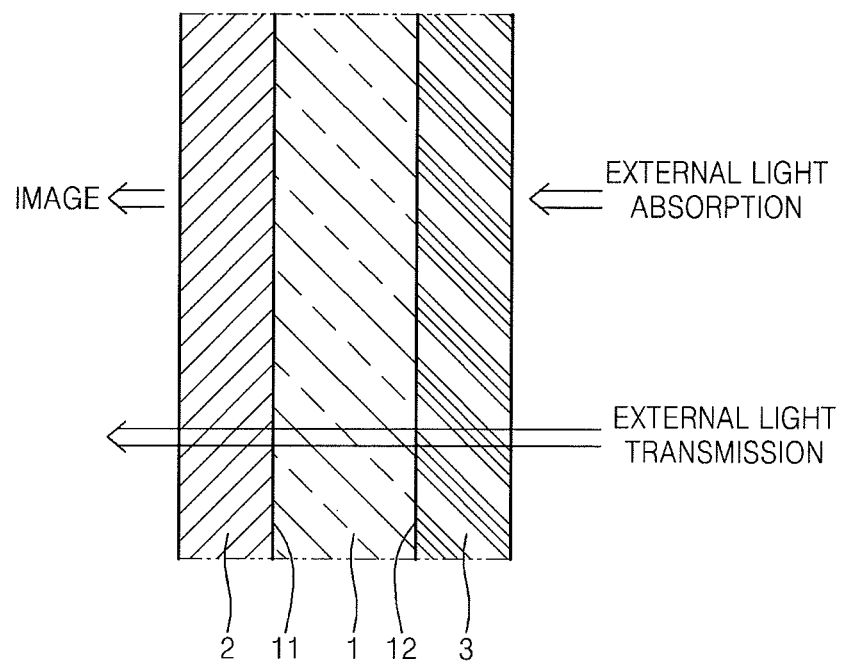
FIG. 1 is a cross-sectional view of an organic light emitting display device according to an embodiment of the present invention.

FIG. 1 is a cross-sectional view of an organic light emitting display device according to an embodiment of the present invention. Referring to FIG. 1, a display unit 2 is formed on a first surface 11 of a substrate 1 and a solar cell unit 3 is formed on a second surface 12 of the substrate 1. In one embodiment, the substrate 1 is formed of a transparent material, such as a transparent glass or a transparent plastic. The first surface 11 and the second surface 12 face each other.

External light enters through the solar cell unit 3, the substrate 1, and the display unit 2, and a portion of the light is absorbed in the solar cell unit 3.

In one embodiment, the display unit 2 is formed to transmit external light. For example, referring to FIG. 1, the display unit 2 is formed in such a way that a user positioned on a side where an image is displayed can observe the image displayed on an outside the solar cell unit 3.

The solar cell unit 3 may additionally include a condenser unit (not shown), and may be electrically connected to the display unit 2 to be used as a power source for driving the display unit 2. The display unit 2 may be connected to a main power source in addition to the solar cell unit 3.

Figure 2:
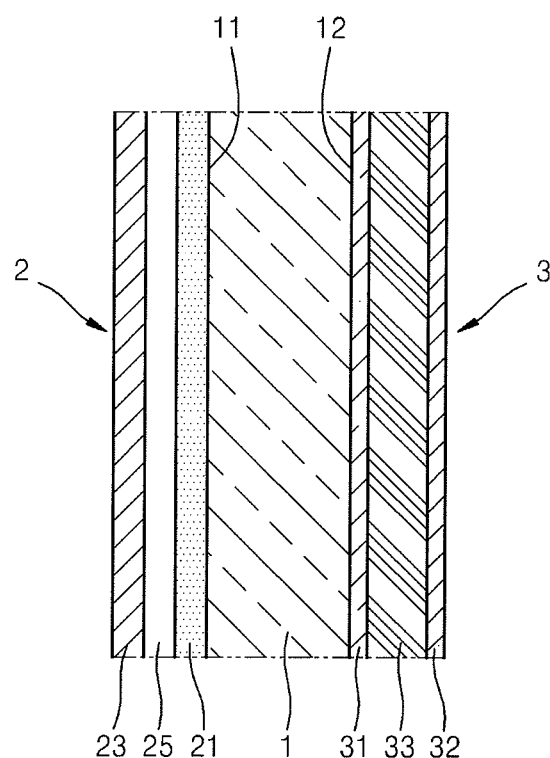
FIG. 2 is a cross-sectional view showing details of an embodiment of the organic light emitting display device of FIG. 1.

FIG. 2 is a cross-sectional view specifically showing an embodiment of the organic light emitting display device of FIG. 1. The display unit 2 includes an organic light emitting unit 21 formed on the first surface 11 of the substrate 1 and a sealing substrate 23 to seal the organic light emitting unit 21.

The sealing substrate 23 may be formed of a transparent material to allow viewing of an image generated by the organic light emitting unit 21 and to prevent external air and moisture from penetrating into the organic light emitting unit 21.

Edges of the sealing substrate 23 and the organic light emitting unit 21 are sealed by a sealant (not shown), and thus, a space 25 is formed between the sealing substrate 23 and the organic light emitting unit 21. The space 25 may be filled with an absorbent or a filler.

Figure 3:
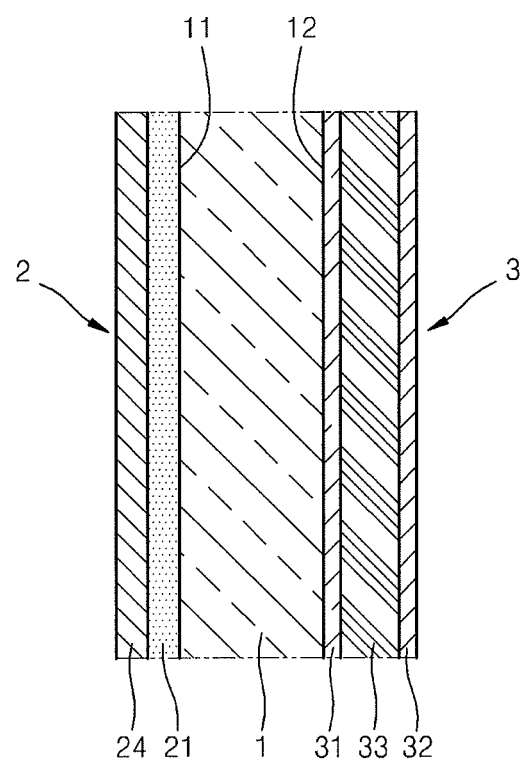
FIG. 3 is a cross-sectional view showing details of another embodiment of the organic light emitting display device of FIG. 1.

FIG. 3 is a cross-sectional view specifically showing another embodiment of the organic light emitting display device of FIG. 1. As shown in FIG. 3, a thin sealing film 24 may be formed on the organic light emitting unit 21 to protect the organic light emitting unit 21 from the environment. The thin sealing film 24 may have a structure in which a film formed of an inorganic material (for example, silicon oxide or silicon nitride) and a film formed of an organic material (for example, epoxy or polyimide) are alternately stacked. The thin sealing film 24 may have any thin film type sealing structure.

The solar cell unit 3 includes a first electrode 31 formed on the second surface 12 of the substrate 1, a solar cell active layer 33 formed on the first electrode 31, and a second electrode 32 formed on the solar cell active layer 33.

The first electrode 31 may be a semi-transparent electrode formed of a thin film metal, for example, Ag, Mg, Al, Pt, Pd, Au, Ni, Nd, Ir, Cr, Li, or Ca. The second electrode 32 may be a transparent electrode formed of a material, for example, ITO, IZO, $In_2O_3$, or ZnO. In this case, since the transmittance of external light that passes through the second electrode 32 is increased, the external light absorption rate of the solar cell unit 3 can be increased.

The first electrode 31 may be a transparent electrode and the second electrode 32 may be a semi-transparent electrode. However, in this case, the external light absorption rate of the solar cell unit 3 may be reduced compared to the embodiment described above.

The solar cell active layer 33 is formed by depositing or printing a material on the first electrode 31. The material may be any material that can be deposited and printed on a transparent electrode base, such as an organic monomer, p-Si, or c-Si. The solar cell active layer 33 may be formed of a material that has semiconductor characteristics, such as a p-n junction, and that may absorb visible light and near infrared light.

As an example, the solar cell active layer 33 may include a nano sized titanium oxide powder, a photosensitive dye that can absorb solar light, and an electrolyte. The electrolyte may be a liquid electrolyte or a solid electrolyte. When a liquid electrolyte is used, a sealing structure is formed to prevent the liquid electrolyte from leaking out of the solar cell active layer 33. Although not shown, the first and second electrodes 31 and 32 may be additionally connected to a condenser unit (not shown).

Figure 4:
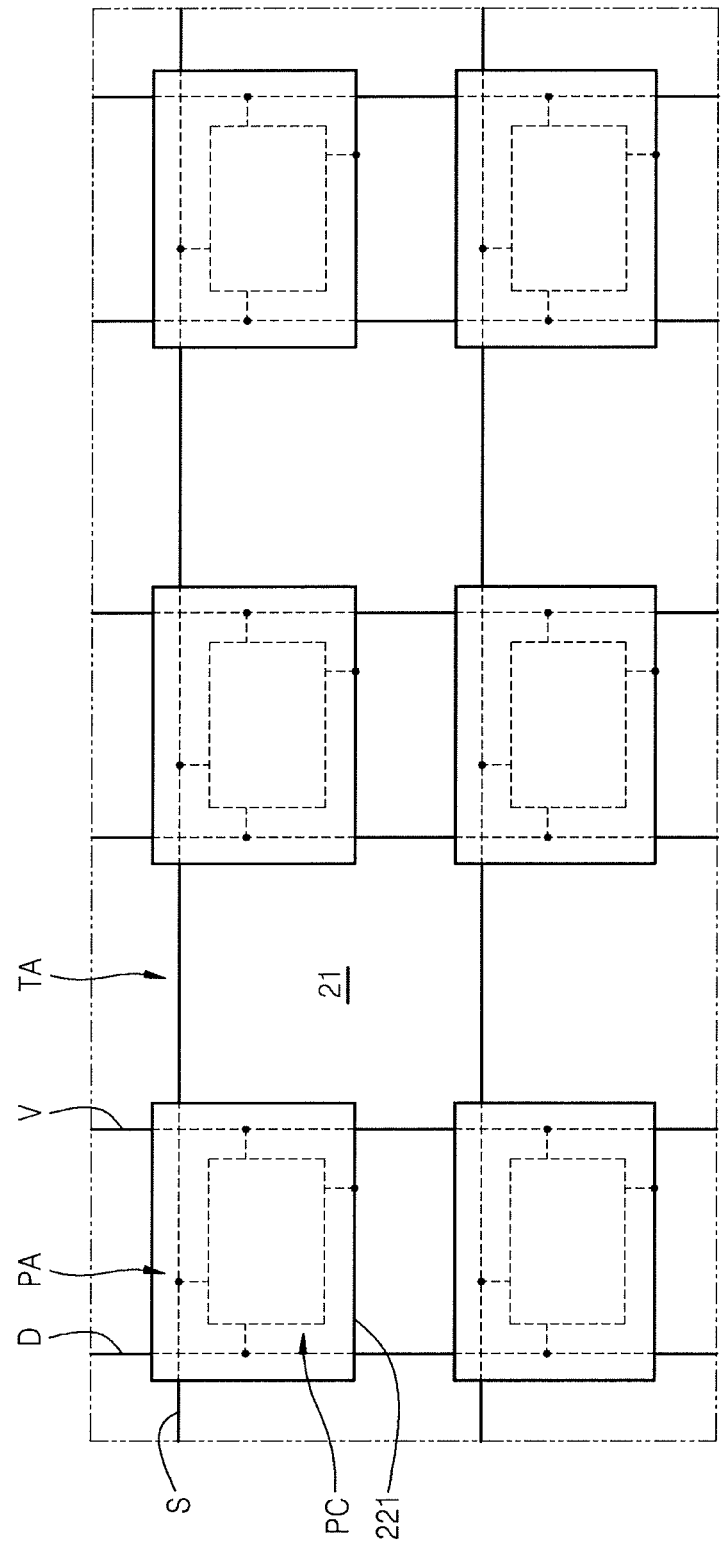
FIG. 4 is a schematic drawing showing an example of the organic light emitting unit of FIG. 2 or FIG. 3.

FIG. 4 is a schematic drawing showing an example of the organic light emitting unit of FIG. 2 or FIG. 3. Referring to FIGS. 2 through 4, the organic light emitting unit 21 is formed on the substrate 1 on which transmitting regions TA (or light transmissive regions) for transmitting external light and pixel regions PA separated from each other and having the transmitting regions TA interposed therebetween are defined.

Each of the pixel regions PA includes a pixel circuit unit PC, and a plurality of conductive lines, such as a scan line S, a data line D, and a driving power line V, are electrically connected to the pixel circuit unit PC. Although not shown, various other conductive lines besides the scan line S, the data line D, and the driving power line V may further be connected to the pixel circuit unit PC according to the configuration of the pixel circuit unit PC. In one embodiment, the pixel circuit unit includes at least one thin film transistor.

Figure 5:
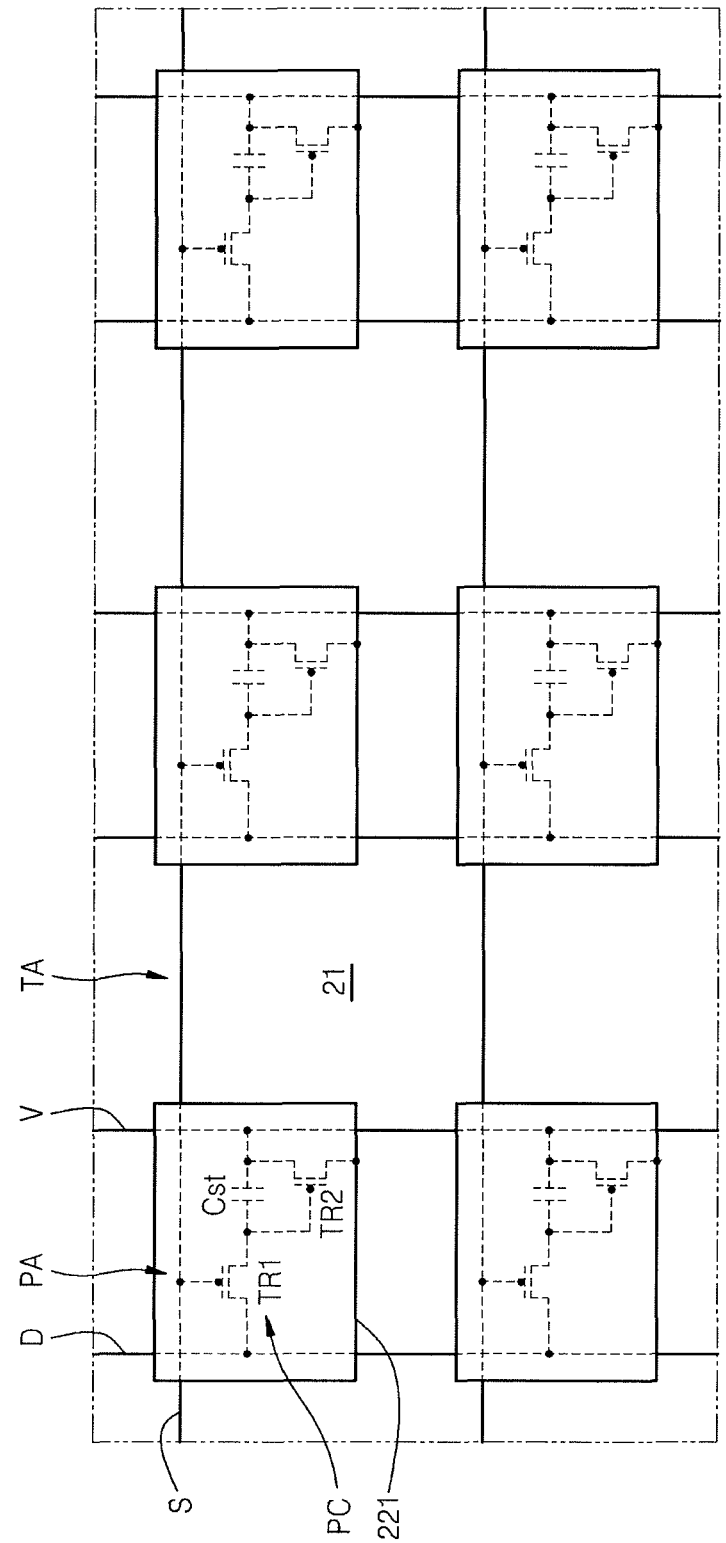
FIG. 5 is a schematic drawing of the organic light emitting unit including an example of a pixel circuit unit of FIG. 4.

FIG. 5 shows an example of the pixel circuit unit PC that includes a first thin film transistor TR1 connected to the scan line S and the data line D, a second thin film transistor TR2 connected to the first thin film transistor TR1 and the driving power line V, and a capacitor Cst connected to the first and second thin film transistors TR1 and TR2. In one embodiment, the first thin film transistor TR1 is a switching transistor and the second thin film transistor TR2 is a driving transistor. The second thin film transistor TR2 is electrically connected to a pixel electrode 221. In FIG. 5, the first and second thin film transistors TR1 and TR2 are P-type transistors, but are not limited thereto, and at least one of the first and second thin film transistors TR1 and TR2 may be an N-type transistor.

According to an embodiment of the present invention, at least one of the conductive lines including scan line S, data line D, and driving power line V are disposed to cross the pixel region PA. However, the present invention is not limited thereto, and all the conductive lines may be disposed to cross the pixel region PA, and no conductive lines may cross the transmitting regions TA.

The pixel regions PA are light emitting regions configured to display an image. Since the pixel circuit unit PC is located in the light emitting regions and all the conductive lines cross the light emitting regions, the user only recognizes light emitting regions and can see outside view through the transmitting regions TA. Thus, solar light can be prevented from scattering caused by interfering with the patterns of internal devices of the pixel circuit unit PC, thereby preventing external image distortion. In one embodiment, at least one of the conductive lines including scan line S, data line D, and driving power line V are disposed to cross the transmitting region TA between the pixel regions PA. However, since the conductive lines are formed to be very thin, the conductive lines can hardly be observed by the user and have little effect on the overall transmittance of the organic light emitting unit 21, and accordingly, a transparent display can be realized. Also, although the user may not see the external image as much in regions covered by the pixel regions PA, in consideration of the overall display region, there is little effect on observing the external image since the pixel regions PA are like a plurality of dots regularly arranged on a surface of a transparent glass. That is, this gives substantially the same effect as tinting a transparent glass.

In one embodiment, the transmitting regions TA and the pixel regions PA are formed in such a way that a ratio of the area of the transmitting regions TA with respect to the overall area of the transmitting regions TA and the pixel regions PA is between about 20% and about 90%.

The above ratio range may provide an optimal balance between the prevention of light scattering and pixel integrity for providing a stable image. For example, if the ratio is greater than or equal to about 20%, the transparency of the device is enhanced. The ratio of the area of the transmitting regions TA with respect to the overall area of the transmitting regions TA and the pixel regions PA may be approximately 20%. In this embodiment, the pixel regions PA are present in an island state with respect to the transmitting regions TA, and scattering of light is minimized since all conductive patterns are disposed across the pixel regions PA, and thus, the display unit 2 may be recognized as a transparent display unit by the user. As will be described later, when a transistor included in the pixel circuit unit PC is formed of a transparent thin film transistor (TFT) such as an oxide semiconductor and an organic light emitting device is a transparent device, the display unit 2 may further be recognized as a transparent display unit. In this case, unlike a conventional transparent display unit, if possible, all conductive patterns are disposed across the pixel regions PA. Accordingly, scattering of light can be prevented, and thus, the user can see an undistorted external image.

Further, if the ratio is less than or equal to about 90%, pixel integrity of the display unit 2 may be enhanced, and thus, a stable image can be realized through the light emission from the pixel regions PA. In one embodiment, as the area of the pixel regions PA is reduced, the amount of light emitted from the organic light emitting film 223 is increased in order to realize an image. However, if the organic light emitting device is operated so as to emit light having a high intensity, the lifetime of the organic light emitting device is rapidly reduced. Also, when the ratio is less than or equal to about 90%, the resolution of the organic light emitting device may be enhanced, since the number of pixel regions PA is not reduced. The ratio of the area of the transmitting regions TA with respect to the entire area of the pixel regions PA and the transmitting regions TA may further be in a range of about 40% to about 70%. This ratio range (about 40% to about 70%) may provide certain advantages. For example, the ratio range of being greater than or equal to about 40% may not significantly limit the user's capability of observing an external image through the transmitting regions TA. Further, the ratio range of being less than or equal to about 70% may make it easier to design the pixel circuit unit PC. However, in other embodiments, ratio ranges other than the above-described ranges can be used.

Figure 6:
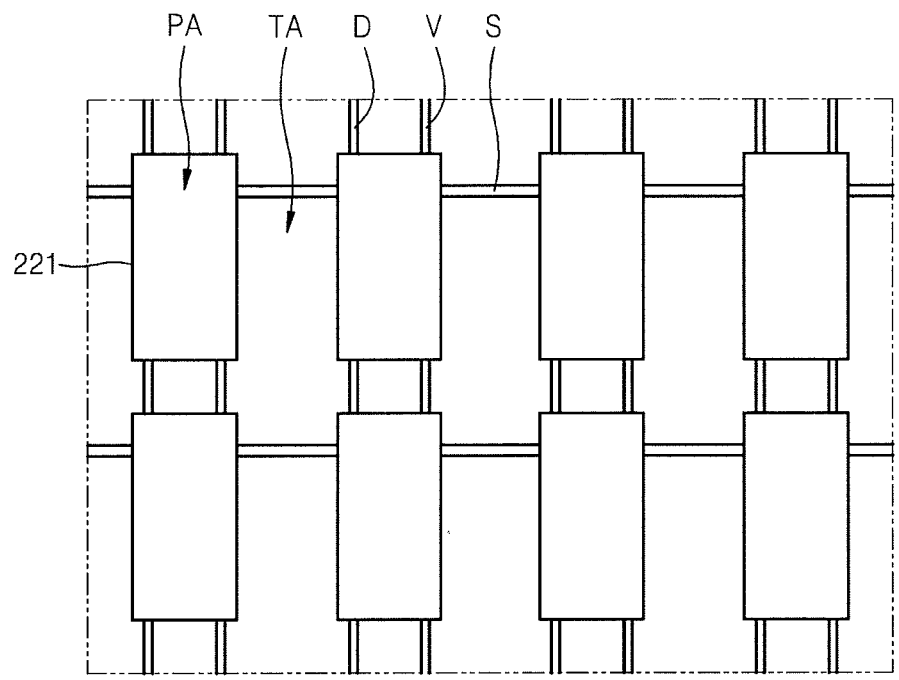
FIG. 6 is a plan view specifically showing an example of the organic light emitting unit of FIG. 5.

Each of the pixel regions PA includes a pixel electrode 221 that has an area corresponding to the area of pixel regions PA and is electrically connected to the pixel circuit unit PC. The pixel circuit unit PC overlaps with the pixel electrode 221 so that the pixel circuit unit PC can be covered by the pixel electrode 221. Also, the conductive lines including the scan line S, the data line D, and the driving power line V are disposed to cross the pixel electrode 221. According to an embodiment of the present invention, the pixel electrode 221 may have an area equal to or slightly greater than that of the pixel region PA. Accordingly, as shown in FIG. 6, when the user observes the organic light emitting unit 21, the pixel circuit unit PC described above is covered by the pixel electrode 221 and a large portion of the conductive lines are also covered. Therefore, scattering of light is greatly reduced as described above and the user sees a portion of the conductive lines through the transmitting regions TA. Accordingly, the user can observe an undistorted external image.

Figure 7:
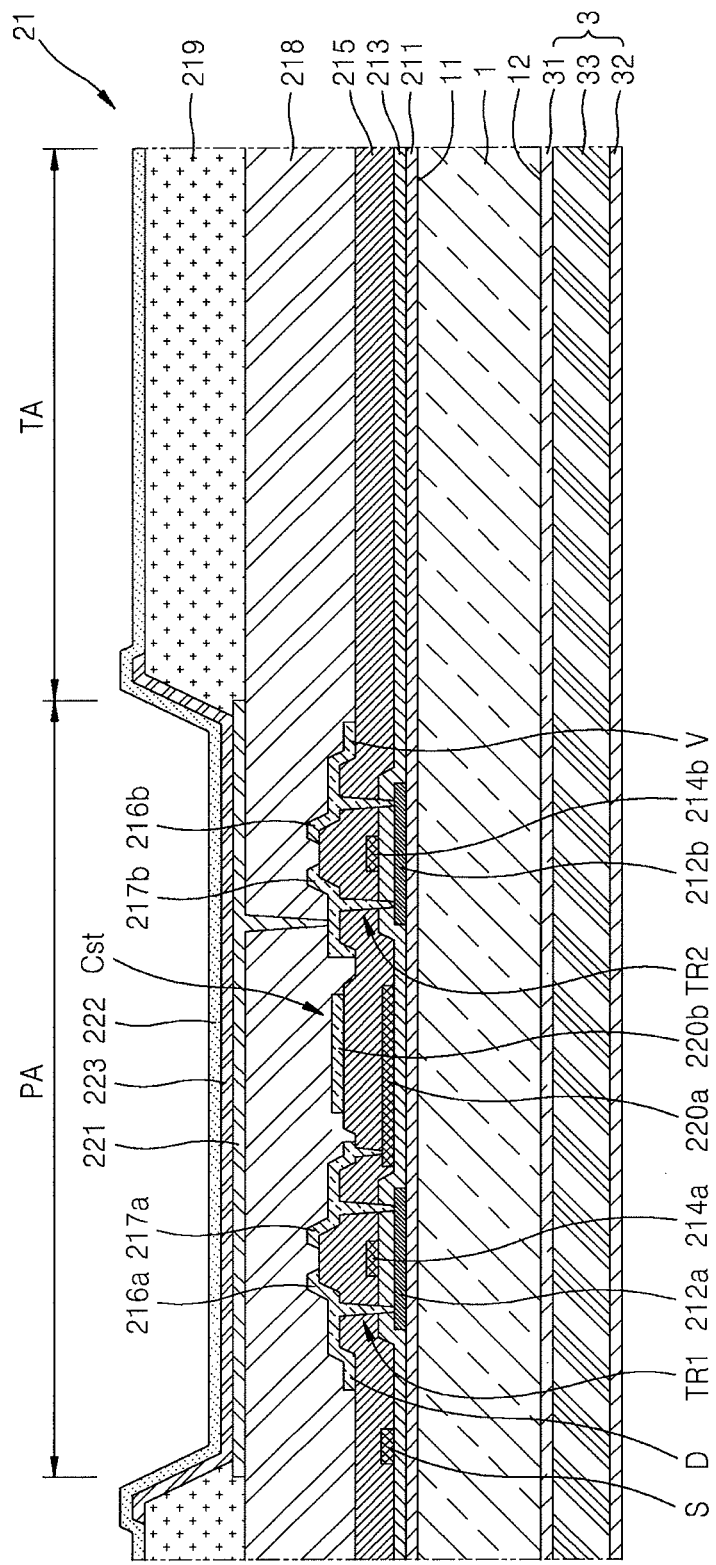
FIG. 7 is a cross-sectional view specifically showing an example of the organic light emitting unit of FIG. 6.

FIG. 7 is a cross-sectional view showing an example of an organic light emitting unit for explaining the organic light emitting unit 21, and the example illustrates the pixel circuit unit PC of FIG. 5 in detail.

According to an embodiment of the present invention, in the organic light emitting unit 21 of FIG. 7, a buffer film 211 is formed on the first surface 11 of the substrate 1, and a first thin film transistor (first TFT) TR1, a capacitor Cst, and a second thin film transistor (second TFT) TR2 are formed on the buffer film 211.

First, a first semiconductor active layer 212a and a second semiconductor active layer 212b are formed on the buffer film 211.

The buffer film 211 prevents impurity elements from penetrating into the organic light emitting unit 21 and planarizes a surface of the organic light emitting unit 21. The buffer film 211 may be formed of any of various materials that can perform the functions described above, for example, an inorganic material such as silicon oxide, silicon nitride, silicon oxynitride, aluminum oxide, aluminum nitride, titanium oxide, or titanium nitride, an organic material such as polyimide, polyester, or acryl, or stacks of these materials. In some embodiments, the buffer film 211 may be omitted.

The first and second semiconductor active layers 212a and 212b may be formed of polycrystal silicon, but are not limited thereto, and may be formed of a semiconductor oxide, for example, a G-I—Z—O layer [$(In_2O_3)a(Ga_2O_3)b(ZnO)c$ layer] (where a, b, and c are integers that respectively satisfy a≥0, b≥0, and c>0). When the first and second semiconductor active layers 212a and 212b are formed of a semiconductor oxide, optical transmittance can further be increased compared to when the active layers are formed of a silicon semiconductor.

A gate insulating film 213 covering the first and second semiconductor active layers 212a and 212b is formed on the buffer film 211, and first and second gate electrodes 214a and 214b are formed on the gate insulating film 213.

An interlayer insulating layer 215 is formed on the gate insulating film 213 to cover the first and second gate electrodes 214a and 214b. A first source electrode 216a and a first drain electrode 217a and a second source electrode 216b and a second drain electrode 217b are each formed on the interlayer insulating layer 215, and are respectively connected to the first semiconductor active layer 212a and the second semiconductor active layer 212b through contact holes.

In FIG. 7, the scan line S may be substantially simultaneously formed with the first and second gate electrodes 214a and 214b. The data line D may be substantially simultaneously formed with the first source electrode 216a and connected to the first source electrode 216a. The driving power line V may be substantially simultaneously formed with the second source electrode 216b and connected to the second source electrode 216b.

In the capacitor Cst, a lower electrode 220a is substantially simultaneously formed with the first and second gate electrodes 214a and 214b, and an upper electrode 220b is substantially simultaneously formed with the first drain electrode 217a.

The structures of the first TFT TR1, the capacitor Cst, and the second TFT TR2 are not limited thereto, and any of various types of TFT and capacitor structures can be employed.

A passivation film 218 is formed to cover the first TFT TR1, the capacitor Cst, and the second TFT TR2. The passivation film 218 may be a single layer or multiple layers of insulating film, an upper surface of which is planarized, and may be formed of an inorganic material and/or an organic material.

A pixel electrode 221 covering the first TFT TR1, the capacitor Cst, and the second TFT TR2 may be formed on the passivation film 218. The pixel electrode 221 is connected to the second drain electrode 217b of the second TFT TR2 through a via hole formed in the passivation film 218. In one embodiment, as shown in FIG. 6, the pixel electrode 221 is formed as an island type independent from each other.

A pixel defining film 219 covering edges of the pixel electrode 221 is formed on the passivation film 218. An organic light emitting layer 223 and a facing electrode 222 are sequentially formed on the pixel electrode 221. The facing electrode 222 is formed on all the pixel regions PA and the transmitting regions TA.

The organic light emitting layer 223 may be a low molecular weight organic film or a polymer organic film. When the organic light emitting layer 223 is a low molecular weight organic film, the organic light emitting layer 223 may be formed by stacking a hole injection Layer (HIL), a hole transport layer (HTL), an emission layer (EML), an electron transport layer (ETL), and an electron injection layer (EIL) in a single structure or a composite structure, and may be formed of any of various material such as copper phthalocyanine (CuPc), N,N'-Di(naphthalene-1-yl)-N,N-diphenyl-benzidine (NPB), or tris-8-hydroxyquinoline aluminum (Alq3). The low molecular weight organic film may be formed by using an evaporation method or a nozzle printing method. At this point, the HIL, the HTL, the ETL, and the EIL are common layers and may be commonly applied to red, green, and blue pixels. Accordingly, unlike the organic light emitting layer in FIG. 7, the common layers may be formed to cover the pixel regions PA and the transmitting regions TA like the facing electrode 222.

In one embodiment, the pixel electrode 221 functions as an anode electrode, and the facing electrode 222 functions as a cathode electrode. Of course, the polarities of the pixel electrode 221 and the facing electrode 222 may be reversed.

According to an embodiment of the present invention, the pixel electrode 221 may be a reflection electrode and the facing electrode 222 may be a transparent electrode. The pixel electrode 221 may be formed of a reflective material or include a reflection film formed of, for example, Ag, Mg, Al, Pt, Pd, Au, Ni, Nd, Ir, Cr, Li, Ca, or a compound of these materials, or an oxide having a high work function such as ITO, IZO, ZnO, or $In_2O_3$. The reflective material or reflection film may be formed only on the surface of the pixel electrode 221 which faces the pixel circuit unit. The facing electrode 222 may be formed of a metal having a low work function such as Ag, Mg, Al, Pt, Pd, Au, Ni, Nd, Ir, Cr, Li, or Ca. Accordingly, the organic light emitting unit 21 is a top emission type in which (an image is displayed in a direction to the facing electrode 222.

When the pixel electrode 221 is a reflection electrode, a pixel circuit unit disposed under the pixel electrode 221 is covered by the pixel electrode 221. Therefore, referring to FIG. 7, at upper outer sides of the facing electrode 222, the user cannot observe the first TFT TR1, the capacitor Cst, and the second TFT TR2 disposed under the pixel electrode 221, as well as portions of the scan line S, the data line D, and the driving power line V. Accordingly, a clear external image can be seen since distortion of the external image due to each of the patterns that constitute the organic light emitting unit 21 is not generated.

The present invention is not limited thereto, for example, the pixel electrode 221 can also be a transparent electrode or a semi-transparent electrode. In this embodiment, the pixel electrode 221 is formed of an oxide having a high work function, such as ITO, IZO, ZnO, or $In_2O_3$. If the pixel electrode 221 is transparent, at the upper outer sides of the facing electrode 222, the user can observe the first TFT TR1, the capacitor Cst, and the second TFT TR2 disposed under the pixel electrode 221, as well as portions of the scan line S, the data line D, and the driving power line V. However, although the pixel electrode 221 is transparent, there is a loss of light since the transmittance of light therethrough cannot be 100%, and the transmittance of external light is further reduced due to the pixel electrode 221 since the conductive patterns are disposed in the region of the pixel electrode 221. Therefore, interference due to the conductive patterns on the external light is reduced as compared when the external light directly enters the conductive patterns, thereby reducing distortion of an external image.

In one embodiment of the present invention, in order to further increase the optical transmittance of the transmitting regions TA, the passivation film 218, the gate insulating film 213, the interlayer insulating layer 215, and the pixel defining film 219 may be formed as transparent insulating films. At this point, the substrate 1 may have a transmittance greater than or equal to the overall transmittance of the transparent insulating films.

Figure 8:
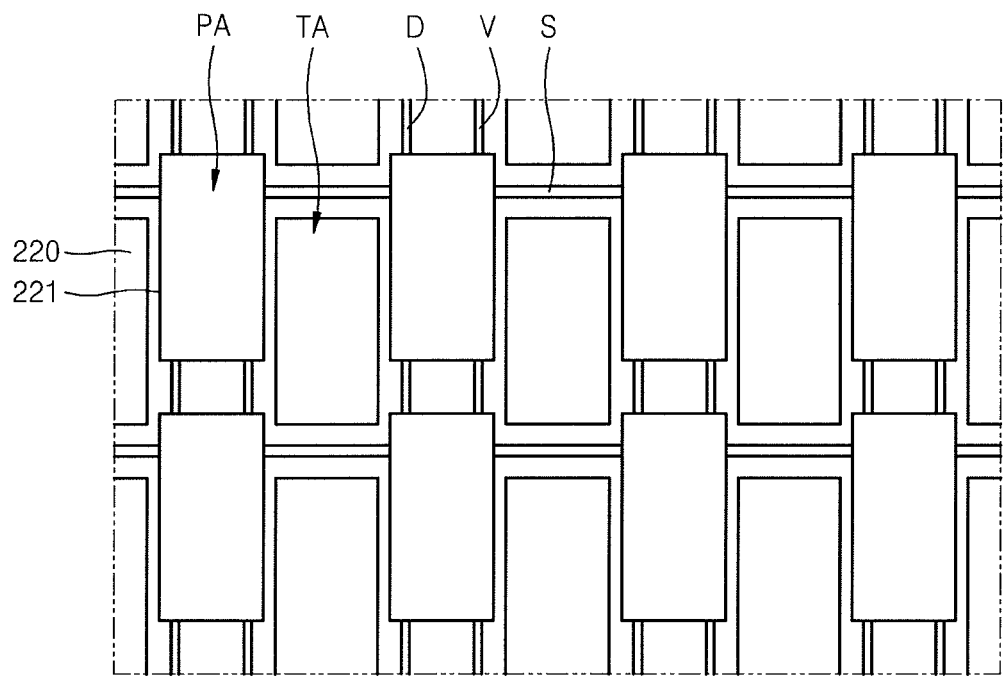
FIG. 8 is a plan view specifically showing another example of the organic light emitting unit of FIG. 5.
Figure 9:
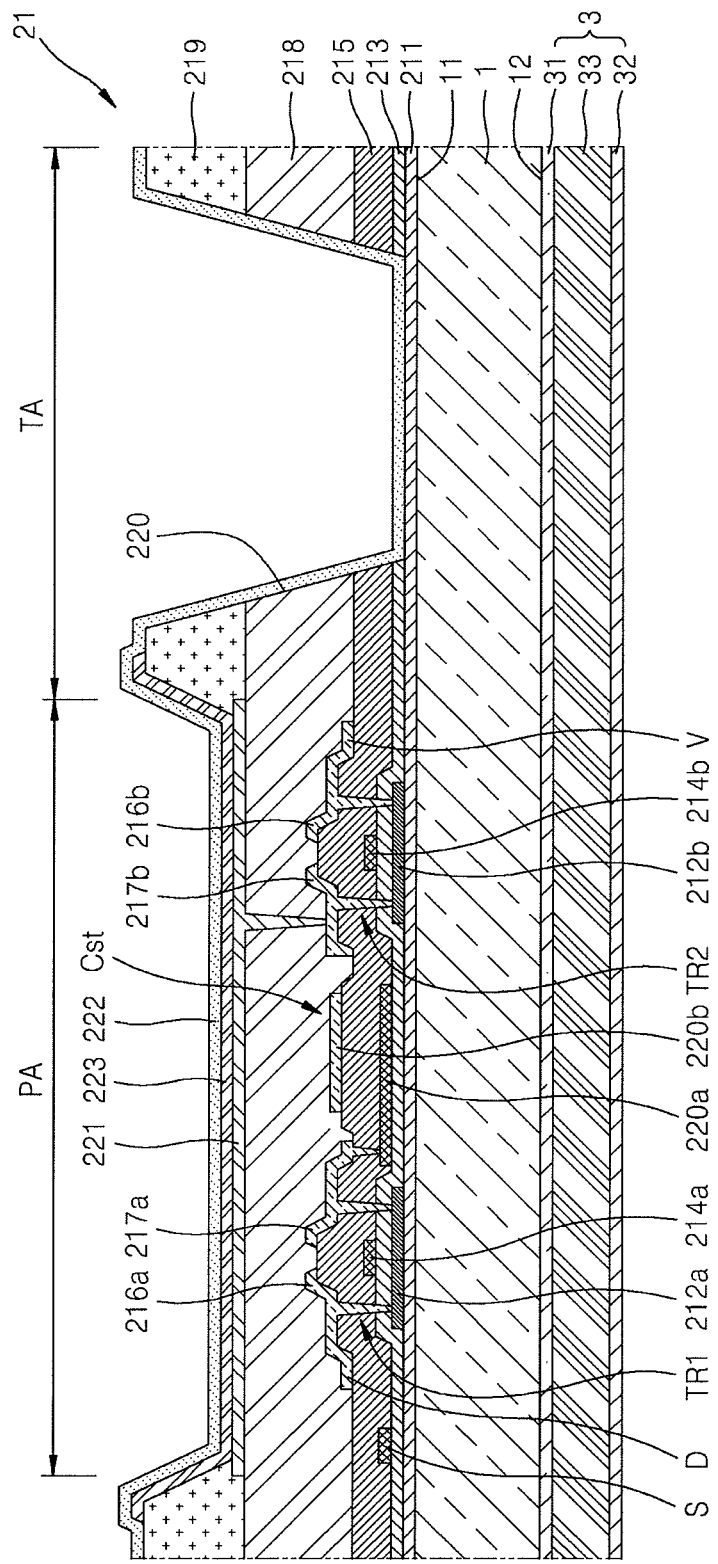
FIG. 9 is a cross-sectional view specifically showing an example of the organic light emitting unit of FIG. 8.

The passivation film 218 is interchangeably used with a first insulating film, and the combination of the gate insulating film 213, the interlayer insulating layer 215, and the pixel defining film 219 is interchangeably used with a second insulating film. FIGS. 8 and 9 are drawings specifically showing another example of the organic light emitting unit of FIG. 5, and show an opening 220 having a predetermined shape, formed in the transparent insulating films in the transmitting regions TA.

The opening 220 may be formed as wide as possible as long as the opening 220 does not interrupt the scan line S, the data line D, and the driving power line V, and may be formed to cross the gate insulating film 213, the interlayer insulating layer 215, the passivation film 218, and the pixel defining film 219. In FIG. 9, the opening 220 is not formed in the buffer film 211 in order to prevent impurities from penetrating into the substrate 1. If necessary, the opening 220 may extend to the buffer film 211.

In this way, the formation of the opening 220 in the transmitting regions TA further increases the optical transmittance of the transmitting regions TA, and thus, an external image can be further clearly observed by the user.

Figure 10:
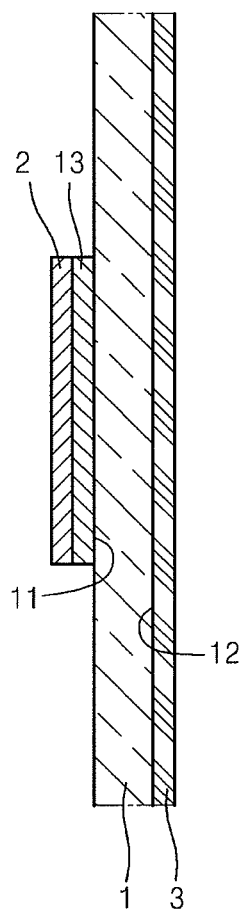
FIG. 10 is a cross-sectional view of an organic light emitting display device according to another embodiment of the present invention.

The display unit 2 according to an embodiment of the present invention as described above, as shown in FIG. 10, is formed on an additional substrate, and thus, can be joined or combined using a sliding method with the first surface 11.

In this case, the substrate 1 having a solar cell unit 3 on the second surface thereof can be a window of a building, and driving power for driving the display unit 2 can be obtained from solar light entered through the solar cell unit 3.

According to an embodiment of the present invention, an organic light emitting display device can prevent distortion of a transmitted image by eliminating light scattering during image display.

At least one embodiment of the present invention also can provide an organic light emitting display device that can reduce power consumption by using power obtained from a solar cell as an auxiliary power source for driving the organic light emitting display device.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. An organic light emitting display device comprising:
   a substrate having a transmitting region and a plurality of pixel regions separated from each other by the transmitting region, wherein the transmitting region is configured to transmit light therethrough, wherein the pixel regions are configured to display an image, and wherein the substrate has first and second surfaces opposing each other;

a plurality of thin film transistors formed in each of the pixel regions over the first surface of the substrate;

a passivation film covering the thin film transistors;

a pixel defining layer formed over the passivation film, wherein the pixel defining layer is not formed directly above any portion of each of the thin film transistors;

a plurality of pixel electrodes formed on the passivation film, wherein each of the pixel electrodes is electrically connected to and formed substantially directly above the corresponding thin film transistor, wherein each of the pixel electrodes is formed only in the corresponding pixel region, and wherein the pixel electrodes are separated from each other;

an organic light emitting layer formed on each of the pixel electrodes and configured to emit light;

a facing electrode formed on the organic light emitting layer and configured to transmit light;

a first electrode formed on the second surface of the substrate;

a solar cell active layer formed on the first electrode; and a second electrode formed on the solar cell active layer, wherein the first electrode is closer to the substrate than the second electrode.

2. The organic light emitting display device of claim 1, wherein each of the pixel electrodes has an area substantially identical to that of one of the pixel regions.

3. The organic light emitting display device of claim 1, further comprising a plurality of conductive lines formed in each of the pixel regions and electrically connected to the corresponding thin film transistor, wherein all of the conductive lines are formed substantially directly below the corresponding pixel electrode.

4. The organic light emitting display device of claim 1, wherein a ratio of 1) a total area of the transmitting region with respect to 2) a total area of the pixel regions and the transmitting region is between about 20% and about 90%.

5. The organic light emitting display device of claim 1, wherein the passivation film is formed on both the transmitting region and the pixel regions and wherein the passivation film is formed of a transparent material.

6. The organic light emitting display device of claim 5, wherein the substrate has a transmittance greater than or equal to that of the passivation film.

7. The organic light emitting display device of claim 1, wherein the passivation film is formed on both the transmitting region and the pixel regions, and wherein the passivation film has a recess in the transmitting region.

8. The organic light emitting display device of claim 1, wherein a plurality of insulating films are formed in the transmitting region, and wherein the insulating films have a recess.

9. The organic light emitting display device of claim 1, wherein at least one of the first electrode and the second electrode is formed of a transparent material.

10. The organic light emitting display device of claim 1, wherein each of the pixel electrodes has a surface which faces the corresponding thin film transistor, and wherein the surface of the pixel electrode is configured to reflect light.

11. The organic light emitting display device of claim 1, wherein each of the pixel electrodes has a first length, wherein each of the thin film transistors has a second length, wherein the first and second lengths are defined in a direction substantially parallel with the first surface of the substrate, and wherein the first length is greater than or equal to the second length.

12. An organic light emitting display device comprising:

a substrate having a transmitting region and pixel regions separated from each other by the transmitting region, wherein the transmitting region is configured to transmit light therethrough, wherein the pixel regions are configured to display an image, and wherein the substrate has first and second surfaces opposing each other;

a plurality of pixel circuit units formed in the pixel regions over the first surface of the substrate respectively, wherein each of the pixel circuit units comprises a plurality of thin film transistors;

a first insulating film covering the pixel circuit units;

a pixel defining layer formed over the first insulating film, wherein the pixel defining layer is not formed directly above any portion of each of the thin film transistors;

a plurality of pixel electrodes formed on the first insulating film, wherein each of the pixel electrodes is electrically connected to and formed substantially directly above the corresponding pixel circuit unit, and wherein the pixel electrodes are separated from each other and formed only in the pixel regions;

an organic light emitting layer formed on each of the pixel electrodes and configured to emit light;

a facing electrode formed on the organic light emitting layer and configured to transmit light;

a first electrode formed on the second surface of the substrate;

a solar cell active layer formed on the first electrode; and a second electrode formed on the solar cell active layer, wherein the first electrode is closer to the substrate than the second electrode.

13. The organic light emitting display device of claim 12, wherein each of the pixel electrodes has an area substantially identical to that of one of the pixel regions.

14. The organic light emitting display device of claim 12, further comprising a plurality of conductive lines formed in each of the pixel regions and electrically connected to the corresponding pixel circuit unit, wherein the conductive lines are formed substantially directly below the corresponding pixel electrode.

15. The organic light emitting display device of claim 12, wherein a ratio of 1) a total area of the transmitting region with respect to 2) a total area of the pixel regions and the transmitting region is between about 20% and about 90%.

16. The organic light emitting display device of claim 12, wherein the transmitting region and the pixel regions each comprise the first insulating film and a plurality of second insulating films, and wherein the first insulating film and the second insulating films are formed of a transparent material.

17. The organic light emitting display device of claim 16, wherein the substrate has a transmittance greater than or equal to the total transmittance of the first insulating film and the second insulating films.

18. The organic light emitting display device of claim 12, wherein the transmitting region and the pixel regions each comprise the first insulating film and a plurality of second insulating films, wherein at least one of the first insulating film and the second insulating films has a recess in the transmitting region.

* * * * *